US011716880B2

(12) United States Patent
Lee

(10) Patent No.: US 11,716,880 B2
(45) Date of Patent: Aug. 1, 2023

(54) DISPLAY DEVICE

(71) Applicant: Samsung Display Co., Ltd., Yongin-si (KR)

(72) Inventor: Minsu Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 30 days.

(21) Appl. No.: 17/467,734

(22) Filed: Sep. 7, 2021

(65) Prior Publication Data

US 2022/0262876 A1    Aug. 18, 2022

(30) Foreign Application Priority Data

Feb. 18, 2021    (KR) .................. 10-2021-0021919

(51) Int. Cl.
| | |
|---|---|
| *H01L 27/32* | (2006.01) |
| *H01L 51/52* | (2006.01) |
| *G06F 3/041* | (2006.01) |
| *G06F 3/044* | (2006.01) |
| *H10K 59/122* | (2023.01) |
| *H10K 50/824* | (2023.01) |
| *H10K 59/40* | (2023.01) |
| *H10K 59/131* | (2023.01) |
| *H10K 102/10* | (2023.01) |

(52) U.S. Cl.
CPC .......... *H10K 59/122* (2023.02); *G06F 3/0412* (2013.01); *G06F 3/0446* (2019.05); *H10K 50/824* (2023.02); *H10K 59/131* (2023.02); *H10K 59/40* (2023.02); *G06F 2203/04112* (2013.01); *H10K 2102/103* (2023.02)

(58) Field of Classification Search
CPC .... G06F 3/0412; G06F 3/0446; G06F 3/0448; G06F 2203/04112; H01L 27/3246; H01L 27/3276; H01L 51/5228; H01L 27/323; H01L 2251/308
See application file for complete search history.

(56) References Cited

U.S. PATENT DOCUMENTS

| 10,824,287 | B2 | 11/2020 | Hwang et al. |
| 10,910,587 | B2 | 2/2021 | Pyo et al. |
| 11,004,919 | B2 | 5/2021 | Kim et al. |
| 2020/0075698 | A1 | 3/2020 | Yang et al. |
| 2022/0028954 | A1* | 1/2022 | Li .................. H01L 27/3258 |

FOREIGN PATENT DOCUMENTS

| KR | 1020160094588 A | 8/2016 |
| KR | 1020180040765 A | 4/2018 |
| KR | 1020190048985 A | 5/2019 |
| KR | 1020200027600 A | 3/2020 |

\* cited by examiner

*Primary Examiner* — Deeprose Subedi
(74) *Attorney, Agent, or Firm* — Cantor Colburn LLP

(57) ABSTRACT

A display device includes a pixel electrode electrically connected to a circuit layer, a pixel definition layer defining a first opening which exposes the pixel electrode and a second opening spaced apart from the pixel electrode, an auxiliary electrode in the second opening and including a material different from the pixel electrode, a light emitting functional layer on the pixel electrode, the pixel definition layer and the auxiliary electrode and defining a through hole corresponding to the auxiliary electrode, and a common electrode on the light emitting functional layer and electrically connected to the auxiliary electrode at the through hole.

20 Claims, 12 Drawing Sheets

DISPLAY DEVICE

This application claims priority to Korean Patent Application No. 10-2021-0021919, filed on Feb. 18, 2021, and all the benefits accruing therefrom under 35 U.S.C. § 119, the contents of which are hereby incorporated by reference in its entirety.

BACKGROUND

1. Field

The disclosure relates to a display device having improved reliability.

2. Description of the Related Art

Multimedia display devices, such as televisions, mobile phones, tablet computers, navigation units, and game units, include a display device to display images. The display devices include an input sensor that provides a touch-based input method allowing users to easily and intuitively input information or commands in addition to the other input methods, such as a button, a keyboard, a mouse, etc.

SUMMARY

The disclosure provides a display device having improved product reliability.

Embodiments provide a display device including a base layer, a circuit layer on the base layer, a pixel electrode on the circuit layer and electrically connected to the circuit layer, a pixel definition layer on the circuit layer and provided with a first opening defined therethrough to expose at least a portion of the pixel electrode and a second opening defined therethrough and spaced apart from the pixel electrode when viewed in a plane, an auxiliary electrode in the second opening and including a material different from the pixel electrode, a light emitting functional layer on the pixel electrode, the pixel definition layer, and the auxiliary electrode and provided with a through hole defined therethrough in an area overlapping the auxiliary electrode, and a common electrode on the light emitting functional layer and electrically connected to the auxiliary electrode via the through hole.

The auxiliary electrode may include an inorganic layer on the circuit layer and a conductive layer on the inorganic layer.

The inorganic layer may include indium zinc oxide, indium tin oxide, silicon oxide, silicon oxynitride, or silicon nitride.

The auxiliary electrode may include a plurality of first mesh lines extending along a first direction and arranged along a second direction crossing the first direction and a plurality of second mesh lines extending along the second direction and arranged along the first direction, and the through hole overlaps a crossing area where one first mesh line among the plurality of first mesh lines and one second mesh line among the plurality of second mesh lines intersect with each other.

The first mesh lines and the second mesh lines may be connected to each other to have an integral shape.

The auxiliary electrode may include an expansion portion defined in the crossing area, and the expansion portion may be expanded in a direction away from the crossing area of the one first mesh line and the one second mesh line.

The expansion portion may have a circular shape or a polygonal shape.

Each of the crossing area and the expansion portion may be provided in plural, and the plurality of expansion portions may respectively overlap the plurality of crossing areas.

The through hole may be provided in plural, and the plurality of through holes may respectively overlap the plurality of crossing areas.

The through hole may be provided in plural, a number of the through holes may be smaller than each of a number of the crossing areas and a number of the plurality of expansion portions, and the plurality of through holes may respectively overlap some crossing areas among the plurality of crossing areas and some expansion portions among the plurality of expansion portions.

Each of the crossing area and the expansion portion may be provided in plural, a number of the plurality of expansion portions may be smaller than a number of the plurality of through holes, and the plurality of expansion portions may respectively overlap some crossing areas among the plurality of crossing areas.

The display device may further include a spacer having a height greater than a height of the pixel definition layer, and the spacer may not overlap the through hole.

The auxiliary electrode may not overlap the spacer.

The display device may further include an active area displaying an image and a peripheral area which is adjacent to the active area, a power line electrically connected to the auxiliary electrode and in the peripheral area and a connection electrode connecting the power line and the auxiliary electrode to each other, and the auxiliary electrode may receive a voltage from the power line via the connection electrode in a portion spaced apart from the active area in the first direction and a portion spaced apart from the active area in the second direction crossing the first direction.

Embodiments provide a display device including a base layer, a circuit layer on the base layer, a pixel electrode on the circuit layer and electrically connected to the circuit layer, a plurality of pixel definition patterns on the circuit layer to cover an edge of the pixel electrode, an auxiliary electrode on the circuit layer and between the plurality of pixel definition patterns, a light emitting functional layer on the pixel electrode, the plurality of pixel definition patterns, and the auxiliary electrode and provided with a through hole defined therethrough in an area overlapping the auxiliary electrode, and a common electrode on the light emitting functional layer and electrically connected to the auxiliary electrode via the through hole.

The plurality of pixel definition patterns may be arranged to be spaced apart from each other, the auxiliary electrode may be provided with a plurality of openings defined therethrough, and the plurality of openings may surround the plurality of pixel definition patterns, respectively, when viewed in a plane.

The auxiliary electrode may include an inorganic layer on the circuit layer and a conductive layer on the inorganic layer.

The inorganic layer may include indium zinc oxide, indium tin oxide, silicon oxide, silicon oxynitride, or silicon nitride.

The auxiliary electrode may include a plurality of first mesh lines extending along a first direction and arranged along a second direction crossing the first direction and a plurality second mesh lines extending along the second direction and arranged along the first direction, and the through hole may overlap a crossing area where one first mesh line among the plurality of first mesh lines and one second mesh line among the plurality of second mesh lines intersect with each other.

The auxiliary electrode may include an expansion portion defined in the crossing area, and the expansion portion may be expanded in a direction away from the crossing area of the one first mesh line and the one second mesh line.

According to the above, the auxiliary electrode is under the light emitting functional layer and closer to the circuit layer, and the common electrode is above the light emitting functional layer. The common electrode is in contact with the auxiliary electrode at the through hole defined through the light emitting functional layer. In addition, the common electrode receives the voltage through the peripheral area defined on left and right of the active area and through the peripheral area defined below the active area. Accordingly, a total electrical resistance of the common electrode is reduced, and a temperature uneven phenomenon in which a temperature in an area increases is reduced or prevented. In addition, as the electrical resistance of the common electrode is reduced, an optical uniformity, e.g., a luminance uniformity, a color uniformity, or the like, may be improved in an active area.

In addition, the opening in which the auxiliary electrode is disposed is defined through the pixel definition layer, and thus, the common electrode has a curved shape which is curved from the sensor layer in an area in which the opening is defined through the pixel definition layer. In this case, a capacitance of a parasitic capacitor formed between the sensor layer and the common electrode is reduced. Thus, a touch sensitivity of the sensor layer is improved.

BRIEF DESCRIPTION OF THE DRAWINGS

The above and other advantages of the disclosure will become readily apparent by reference to the following detailed description when considered in conjunction with the accompanying drawings where.

DETAILED DESCRIPTION

Figure 1:
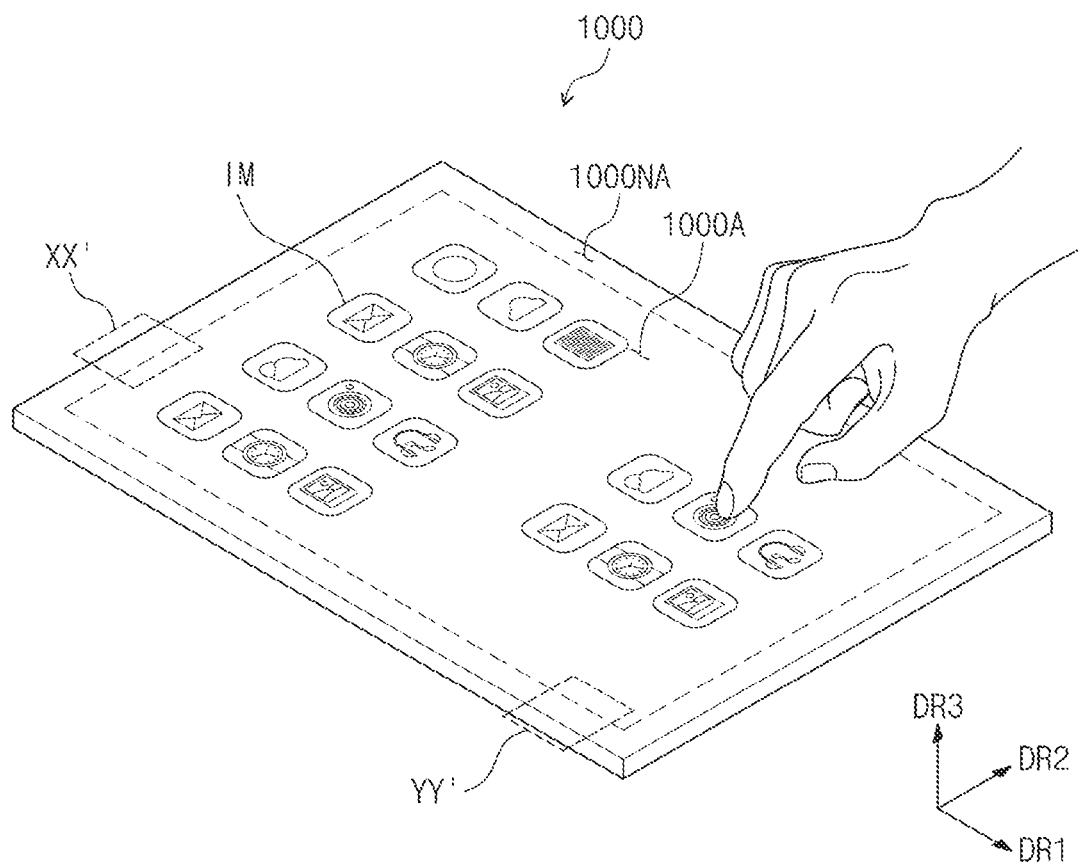
FIG. 1 is a perspective view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being related to another element such as being "on", "connected to" or "coupled to" another element or layer, it can be directly on, connected or coupled to the other element or layer or intervening elements or layers may be present. In contrast, when an element or layer is referred to as being related to another element such as being "directly on", "directly connected to" or "directly coupled to" another element or layer, no other element or layer or intervening elements or layers are present.

Like numerals refer to like elements throughout. In the drawings, the thickness, ratio, and dimension of components are exaggerated for effective description of the technical content.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms, "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as shown in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

FIG. 1 is a perspective view showing an embodiment of a display device 1000.

Referring to FIG. 1, the display device 1000 may be a device that is activated in response to electrical signals. In embodiments, for example, the display device 1000 may be a television, a monitor, a notebook computer, a mobile phone, a foldable mobile phone, a tablet computer, a car navigation unit, a game unit, or a wearable device, however, should not be limited thereto or thereby. In FIG. 1, a tablet computer will be described as a representative example of the display device 1000.

The display device 1000 may include an active area 1000A and a peripheral area 1000NA defined therein. The display device 1000 may display an image IM through the active area 1000A (e.g., display area). The active area 1000A may include or be provided in a plane defined by a first direction DR1 and a second direction DR2 which crosses the first direction DR1. In an embodiment, the peripheral area 1000NA may surround the active area 1000A. An image IM may not be displayed at the peripheral area 1000NA (e.g., non-display area). The peripheral area 1000NA may be adjacent to the display area (e.g., active area 1000A).

A thickness direction of the display device 1000 may be substantially parallel to a third direction DR3 crossing each of the first direction DR1 and the second direction DR2. Accordingly, front (or upper) and rear (or lower) surfaces of each member of the display device 1000 may be defined with respect to the third direction DR3. A plan view or plane view may be defined along the third direction DR3.

The display device 1000 may sense an input applied thereto from the outside of the display device 1000. As an example, the input from the outside (e.g., external input) may be an input caused by an input member, such as a user's body, a passive pen, etc., that leads a variation of a capacitance or an input member of an active type that provides a driving signal as an electrical signal.

Figure 2:
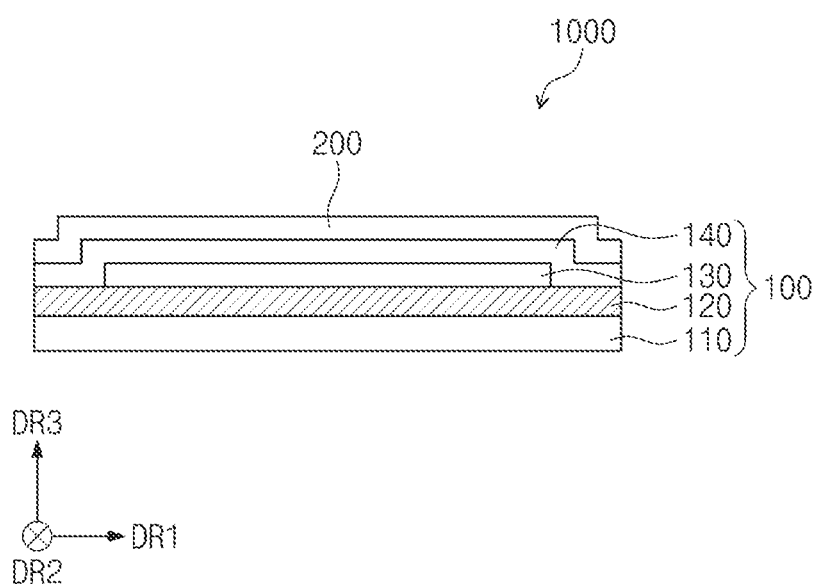
FIG. 2 is a cross-sectional view showing an embodiment of a display device.

FIG. 2 is a cross-sectional view showing the display device 1000.

Referring to FIG. 2, the display device 1000 may include a display layer 100 and a sensor layer 200.

The display layer 100 may have a configuration that substantially generates the image IM. The display layer 100 may be a light emitting type display layer. In an embodiment, for example, the display layer 100 may be an organic light emitting display layer, a quantum dot display layer, a micro-LED display layer, or a nano-LED display layer.

The display layer 100 may include a base layer 110 (e.g., first base layer), a circuit layer 120, a light emitting element layer 130, and an encapsulation layer 140.

The base layer 110 may be a member that provides a base surface on which the circuit layer 120 is disposed or provided. The base layer 110 may be a glass substrate, a metal substrate, or a polymer substrate, however, should not be limited thereto or thereby. According to an embodiment, the base layer 110 may be an inorganic layer, an organic layer, or a composite material layer.

The base layer 110 may have a multi-layer structure. In an embodiment, for example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "X-based resin", as used herein, refers to the resin that includes a functional group of X.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be provided or formed on the base layer 110 such as by a coating or depositing process. Then, the insulating layer, the semiconductor layer, and the conductive layer may be selectively patterned through several photolithography processes. The semiconductor pattern, the conductive pattern, and the signal line included in the circuit layer 120 may be formed.

The light emitting element layer 130 may be disposed on the circuit layer 120. The light emitting element layer 130 may include a light emitting element 100PE. In an embodiment, for example, the light emitting element layer 130 may include an organic light emitting material, a quantum dot, a quantum rod, a micro-LED, or a nano-LED. The circuit layer 120 may be connected to the light emitting element layer 130 to control or drive the light emitting element layer 130 to generate or emit light, display an image IM, etc.

The encapsulation layer 140 may be disposed on the light emitting element layer 130. The encapsulation layer 140 may protect the light emitting element layer 130 from moisture, oxygen, and foreign substances, such as dust particles.

The sensor layer 200 may be disposed on the display layer 100. The sensor layer 200 may sense an external input applied thereto from the outside (e.g., input sensing layer). In an embodiment, for example, the external input may be an input from a user of the display device 1000. The user input may include a variety of forms of external inputs, such as a part of the user's body, light, heat, pen, or pressure.

The sensor layer 200 may be provided or formed on the display layer 100 through successive processes. In this case, the sensor layer 200 may be described as being disposed directly on the display layer 100. In the disclosure, the expression "the sensor layer 200 is disposed directly on the display layer 100" means that no intervening elements are present between the sensor layer 200 and the display layer 100. That is, a separate adhesive member may not be disposed between the sensor layer 200 and the display layer 100 (e.g., may be omitted).

According to an embodiment, the sensor layer 200 may be combined with the display layer 100 by an adhesive member. The adhesive member may include any of a number of adhesives which combine the sensor layer 200 with the display layer 100.

Although not shown in figures, the display device 1000 may further include an anti-reflective layer and/or an optical layer, which are disposed on the sensor layer 200. The anti-reflective layer may reduce a reflectance of an external light incident thereto from the outside of the display device 1000. The optical layer may control a traveling direction of a light incident thereto from the display layer 100 to improve a front luminance of the display device 1000.

Figure 3:
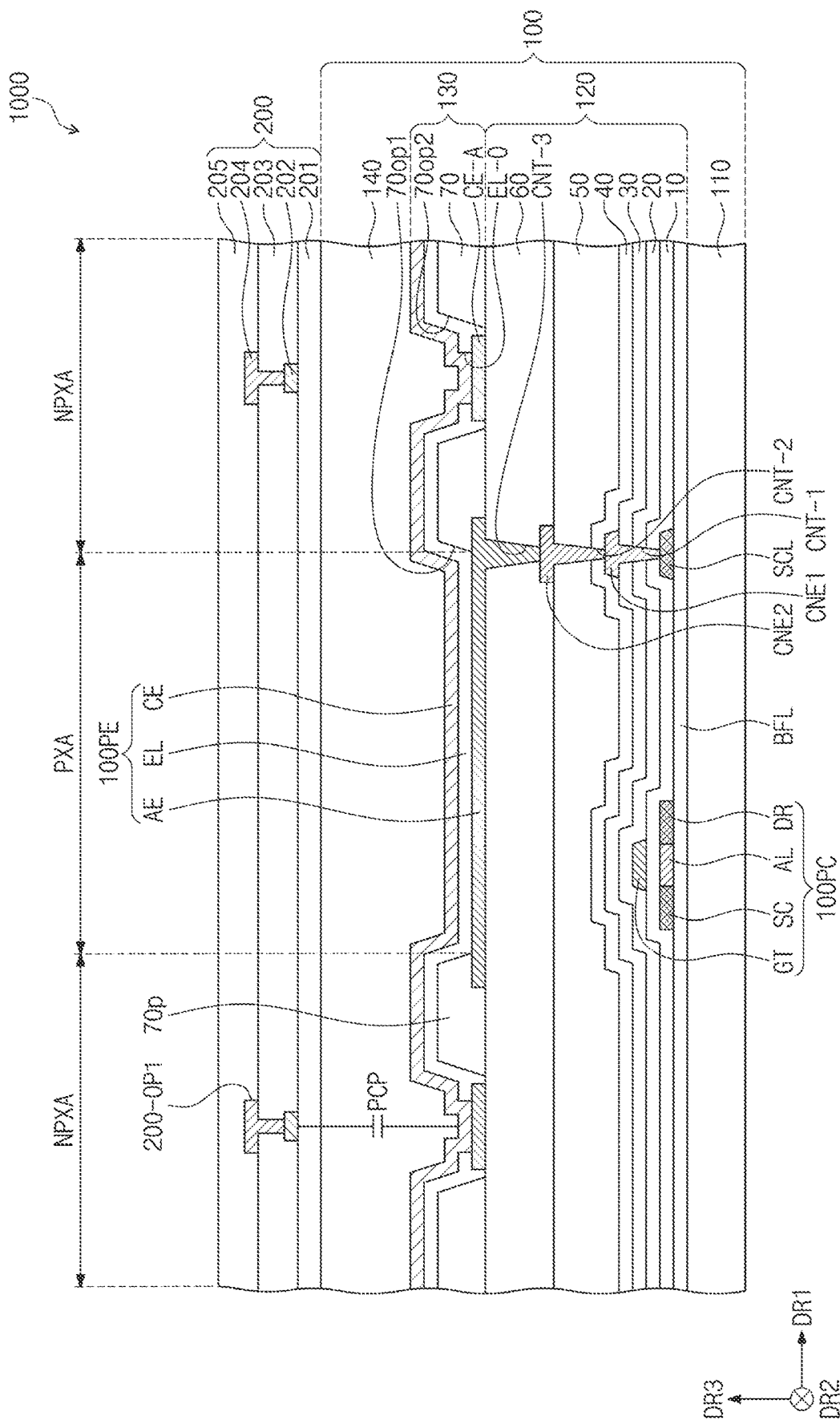
FIG. 3 is a cross-sectional view showing an embodiment of a display device.

FIG. 3 is a cross-sectional view showing an embodiment of the display device 1000.

Referring to FIG. 3, at least one inorganic layer may be formed on an upper surface of the base layer 110. The inorganic layer may include at least one of aluminum oxide, titanium oxide, silicon oxide, silicon nitride, silicon oxynitride, zirconium oxide, and hafnium oxide. The inorganic layer may be formed in multiple layers. The inorganic layers may form a barrier layer and/or a buffer member layer. In the embodiment, the display layer 100 may include a buffer layer BFL.

The buffer layer BFL may increase a coupling force between the base layer 110 and the semiconductor pattern. The buffer layer BFL may include at least one of silicon oxide, silicon nitride, and silicon oxynitride. In an embodiment, for example, the buffer layer BFL may have a stack structure in which a silicon oxide layer and a silicon nitride layer are alternately stacked with each other.

The semiconductor pattern may be disposed on the buffer layer BFL. The semiconductor pattern may include polysilicon, however, should not be limited thereto or thereby. The semiconductor pattern may include amorphous silicon, low temperature polycrystalline silicon, or oxide semiconductor.

FIG. 3 shows only a portion of the semiconductor pattern, and the semiconductor pattern may be further disposed in other areas of the display layer 100. The semiconductor pattern may be arranged over pixels. The semiconductor pattern may have different electrical properties depending on the presence or absence of doping or whether the dopant includes an N-type dopant (e.g., N-doped) or a P-type dopant (e.g., P-doped). The semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or signal line. The second region may substantially correspond to an active (or a channel) of a transistor 100PC. In other words, a portion of the semiconductor pattern may be the channel of the transistor 100PC, another portion of the semiconductor pattern may be a source or a drain of the transistor 100PC, and the other portion of the semiconductor pattern may be a connection electrode or a connection signal line.

Each of the pixels may have an equivalent circuit that includes seven transistors, one capacitor, and a light emitting element 100PE, and the equivalent circuit of the pixel may be changed in various ways. FIG. 3 shows one of the transistor 100PC and the light emitting element 100PE which is included in the pixel.

A source SC, an active region AL, and a drain DR of the transistor 100PC may be formed from the semiconductor pattern. The source SC and the drain DR may extend in opposite directions from the active region AL in a cross-section. FIG. 3 shows a portion of a connection signal line SCL formed from the semiconductor pattern. Although not shown in figures, the connection signal line SCL may be connected to the drain DR of the transistor 100PC in a plane.

A first insulating layer 10 may be disposed on the buffer layer BFL. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In the embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, should not be limited thereto or thereby.

A gate GT of the transistor 100PC may be disposed on the first insulating layer 10. The gate GT may be a portion of a metal pattern. The gate GT may overlap the active region AL. The gate GT may be used as a mask in a process of doping the semiconductor pattern.

A second insulating layer 20 may be disposed on the first insulating layer 10 and may cover the gate GT. The second insulating layer 20 may commonly overlap the pixels. The second insulating layer 20 may be an inorganic layer and/or an organic layer and may have a single-layer or multi-layer structure. The second insulating layer 20 may include at least one of silicon oxide, silicon nitride, and silicon oxynitride. In the embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer or multi-layer structure. As an example, the third insulating layer 30 may have a multi-layer structure of a silicon oxide layer and a silicon nitride layer.

A first connection electrode CNE1 may be disposed on the third insulating layer 30. The first connection electrode CNE1 may be connected to the connection signal line SCL via a first contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a second contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. The light emitting element layer 130 may include an organic light emitting material, a quantum dot, a quantum rod, a micro-LED, or a nano-LED. Hereinafter, the organic light emitting element will be described as the light emitting element 100PE, however, should not be particularly limited.

The light emitting element 100PE may include a pixel electrode AE (e.g., first electrode), a light emitting functional layer EL, and a common electrode CE (e.g., second electrode). The first electrode may face the second electrode with the light emitting functional layer EL therebetween.

The pixel electrode AE may be disposed on the sixth insulating layer 60. The pixel electrode AE may be connected to the second connection electrode CNE2 via a third contact hole CNT-3 defined through the sixth insulating layer 60.

A pixel definition layer 70 may be disposed on the sixth insulating layer 60 and may cover a portion of the pixel electrode AE. A first opening 70op1 through which at least a portion of the pixel electrode AE is exposed to outside the pixel definition layer 70 and a second opening 70op2 defined in an area spaced apart from the first opening 70op1 in a direction along the pixel definition layer 70 may be defined through the pixel definition layer 70. When viewed in a plane, the second opening 70op2 may be spaced apart from the pixel electrode AE. The pixel definition layer 70 may include a pixel definition pattern 70p provided in plural including a plurality of pixel definition patterns 70p due to the second opening 70op2. One of the pixel definition patterns 70p may be disposed on one of the pixel electrode AE. As an example, one of the pixel definition patterns 70p may cover an edge of the pixel electrode AE. A portion of the pixel electrode AE, which is not covered by the pixel definition pattern 70p, may correspond to a light emitting area PXA described later. The pixel definition pattern 70p may be a solid portion of the pixel definition layer 70 which defines the various openings therein.

An auxiliary electrode CE-A may be disposed in the second opening 70op2. As an example, the auxiliary electrode CE-A may be disposed between the pixel definition patterns 70p which are adjacent to each other along the base layer 110. The auxiliary electrode CE-A may include a material different from that of the pixel electrode AE. As an example, the auxiliary electrode CE-A may be formed after the pixel electrode AE is formed such as by using a different material and/or a different material layer on the base layer 110. The auxiliary electrode CE-A will be described in detail later.

The active area 1000A (refer to FIG. 1) may include the light emitting area PXA and a non-light-emitting area NPXA which is adjacent to the light emitting area PXA. Each pixel may include the light emitting area PXA and a non-light-emitting area NPXA without being limited thereto. In an embodiment, the non-light-emitting area NPXA may surround the light emitting area PXA. In the embodiment, the light emitting area PXA may be defined to correspond to the portion of the pixel electrode AE which is exposed through the first opening 70op1 to outside the pixel definition layer 70.

The light emitting functional layer EL may be commonly disposed in the light emitting area PXA and the non-light-emitting area NPXA. The light emitting functional layer EL may cover the pixel electrode AE, the pixel definition layer 70, and the auxiliary electrode CE-A.

The light emitting functional layer EL may include a plurality of layers. As an example, the light emitting functional layer EL may include a hole control layer, an electron control layer, and a light emitting layer disposed between the hole control layer and the electron control layer.

The hole control layer may be disposed between the pixel electrode AE and the light emitting layer. The hole control layer may be commonly disposed in the light emitting area PXA and the non-light-emitting area NPXA. The hole control layer may include a hole transport layer and may further include a hole injection layer. The electron control layer may be disposed between the light emitting layer and the common electrode CE. The electron control layer may include an electron transport layer and may further include an electron injection layer. Each of the hole control layer and the electron control layer may be commonly formed in the plural pixels using an open mask.

The light emitting layer may be disposed in an area corresponding to the first opening 70op1. That is, the light emitting layer may be formed in each pixel after being divided into plural portions (or patterns) along the base layer 110. When the light emitting layer is formed in each pixel after being divided into plural portions, each of the light emitting layers may emit a light having one of a blue color, a red color, and a green color, however, should not be limited thereto or thereby. According to an embodiment, the light emitting layer may be commonly provided in the pixels to be connected to each other. In this case, the light emitting layer may provide a blue light or a white light. In addition, when the light emitting layer is commonly provided in the pixels to be connected to each other, the light emitting layer may be commonly disposed over the light emitting area PXA and the non-light-emitting area NPXA, and the light emitting layer may be commonly formed over the pixels such as by using an open mask.

The common electrode CE may be disposed on the light emitting functional layer EL. The common electrode CE may have an integral shape and may be commonly disposed over the pixels. The common electrode CE may be electrically connected to the auxiliary electrode CE-A via a through hole EL-O defined through the light emitting functional layer EL. The through hole EL-O may be defined in an area overlapping the auxiliary electrode CE-A and may be defined in an area overlapping the second opening 70op2.

The through hole EL-O may be formed by irradiating a laser beam onto the light emitting functional layer EL. A size of the through hole EL-O may be changed by adjusting an intensity of the laser beam. As the through hole EL-O is defined through the light emitting functional layer EL, the common electrode CE may be directly in contact with the auxiliary electrode CE-A at the through hole EL-O. Accordingly, a total electrical resistance of the common electrode CE may be reduced. As the electrical resistance of the common electrode CE is reduced, a phenomenon of uneven temperature in which a temperature in an area of the display device 1000 increases may be reduced or prevented. In addition, as the electrical resistance of the common electrode CE is reduced, an optical uniformity, e.g., a luminance uniformity, a color uniformity, or the like, may be improved in the active area 1000A (refer to FIG. 1).

The encapsulation layer 140 may be disposed on the light emitting element layer 130. The encapsulation layer 140 may include an inorganic layer, an organic layer, and an inorganic layer, which are sequentially stacked one on another, however, the layers of the encapsulation layer 140 should not be limited thereto or thereby.

The inorganic layers within the encapsulation layer 140 may protect the light emitting element layer 130 from moisture and oxygen, and the organic layer within the encapsulation layer 140 may protect the light emitting element layer 130 from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer, however, should not be limited thereto or thereby.

The sensor layer 200 may include a second base layer 201, a first conductive layer 202, a sensing insulating layer 203, a second conductive layer 204, and a cover insulating layer 205.

The second base layer 201 may be an inorganic layer including at least one of silicon nitride, silicon oxynitride, and silicon oxide. According to an embodiment, the second base layer 201 may be an organic layer including an epoxy-based resin, an acrylic-based resin, or an imide-based resin. The second base layer 201 may have a single-layer structure or a multi-layer structure of layers stacked in the third direction DR3.

Each of the first conductive layer 202 and the second conductive layer 204 may have a single-layer structure or a multi-layer structure of layers stacked along the third direction DR3. Each of the first conductive layer 202 and the second conductive layer 204 may be defined by conductive patterns spaced apart from each other along the base layer 110. The conductive patterns may be solid portions of the first conductive layer 202 and the second conductive layer 204 and may define a sensor opening 200-OP1 of the sensor layer 200.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide ("ITO"), indium zinc oxide ("IZO"), zinc oxide (ZnO), indium zinc tin oxide ("ITZO"), or the like. In addition, the transparent conductive layer may include conductive polymer such as flexible transparent material like poly(3,4-ethylenedioxythiophene) ("PEDOT"), metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

At least one of the sensing insulating layer 203 and the cover insulating layer 205 may include an inorganic layer. The inorganic layer may include at least one of aluminum oxide, titanium oxide, silicon oxide, silicon nitride, silicon oxynitride, zirconium oxide, and hafnium oxide.

At least one of the sensing insulating layer 203 and the cover insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

A parasitic capacitor PCP may be generated between the first conductive layer 202 and the common electrode CE. A capacitance of the capacitor is inversely proportional to a distance between two conductors forming the capacitor and is proportional to a permittivity of an insulating layer disposed between the conductors.

According to an embodiment, at least a portion of each of the first conductive layer 202 and the second conductive layer 204 may overlap the second opening 70op2. Accordingly, a distance between the first conductive layer 202 and the common electrode CE may increase in an area where the second opening 70op2 is defined. As a result, an electrical capacitance of a parasitic capacitor PCP in the area overlapping or corresponding to the second opening 70op2 may be smaller than a capacitance of a parasitic capacitor between the common electrode CE disposed above the pixel definition layer 70 and the first conductive layer 202. In addition, a permittivity of an organic layer, e.g., a monomer, included in the encapsulation layer 140 may be smaller than a permittivity of the pixel definition layer 70. Accordingly, the electrical capacitance of the parasitic capacitor PCP may be further reduced. The capacitance of the parasitic capacitor PCP between the common electrode CE and the first conductive layer 202 may be reduced due to the second opening 70op2, and as a result, a touch sensitivity of the sensor layer 200 may be improved.

Figure 4A:
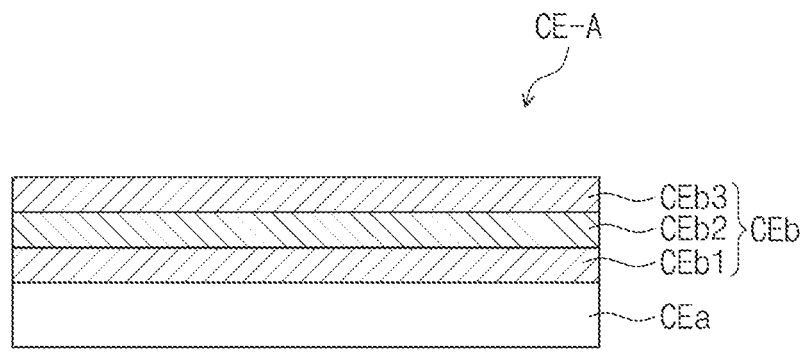
FIG. 4A is a cross-sectional view showing an embodiment of an auxiliary electrode.
Figure 4A:
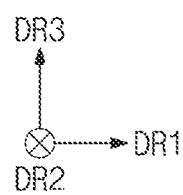

FIG. 4A is a cross-sectional view showing an embodiment of the auxiliary electrode CE-A.

Referring to FIGS. 3 and 4A, the auxiliary electrode CE-A may include an auxiliary inorganic layer CEa and an auxiliary conductive layer CEb. The auxiliary conductive layer CEb may be disposed on the auxiliary inorganic layer CEa. The auxiliary inorganic layer CEa and the auxiliary conductive layer CEb may be otherwise referred to as an auxiliary inorganic pattern and an auxiliary conductive pattern.

The auxiliary inorganic layer CEa may include at least one of indium zinc oxide, indium tin oxide, silicon oxide, silicon oxynitride, and silicon nitride. When the auxiliary electrode CE-A is formed, the auxiliary inorganic layer CEa may prevent other layers from being damaged.

The auxiliary conductive layer CEb may be disposed on the auxiliary inorganic layer CEa. The auxiliary conductive layer CEb may include a first auxiliary conductive layer CEb1, a second auxiliary conductive layer CEb2, and a third auxiliary conductive layer CEb3 in order from the auxiliary inorganic layer CEa. The first auxiliary conductive layer CEb1, the second auxiliary conductive layer CEb2, and the third auxiliary conductive layer CEb3 may be sequentially disposed on the auxiliary inorganic layer CEa. The first auxiliary conductive layer CEb1 and the third auxiliary conductive layer CEb3 may include titanium, and the second auxiliary conductive layer CEb2 may include aluminum, however, should not be particularly limited.

Figure 4B:
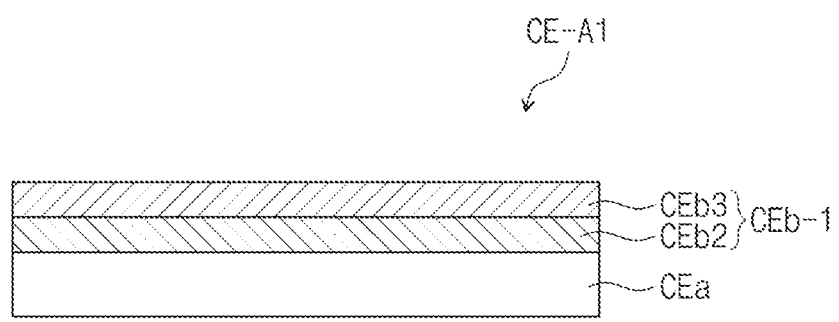
FIG. 4B is a cross-sectional view showing an embodiment of an auxiliary electrode.
Figure 4B:
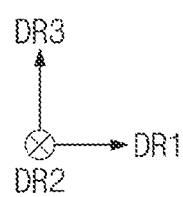

FIG. 4B is a cross-sectional view showing an embodiment of an auxiliary electrode CE-A1.

Referring to FIGS. 3 and 4B, the auxiliary electrode CE-A1 may include an auxiliary inorganic layer CEa and an auxiliary conductive layer CEb-1. The auxiliary conductive layer CEb-1 may include the second auxiliary conductive layer CEb2 and the third auxiliary conductive layer CEb3, which are described with reference to FIG. 4A. The second auxiliary conductive layer CEb2 and the third auxiliary conductive layer CEb3 may be sequentially disposed on the auxiliary inorganic layer CEa.

Figure 4C:
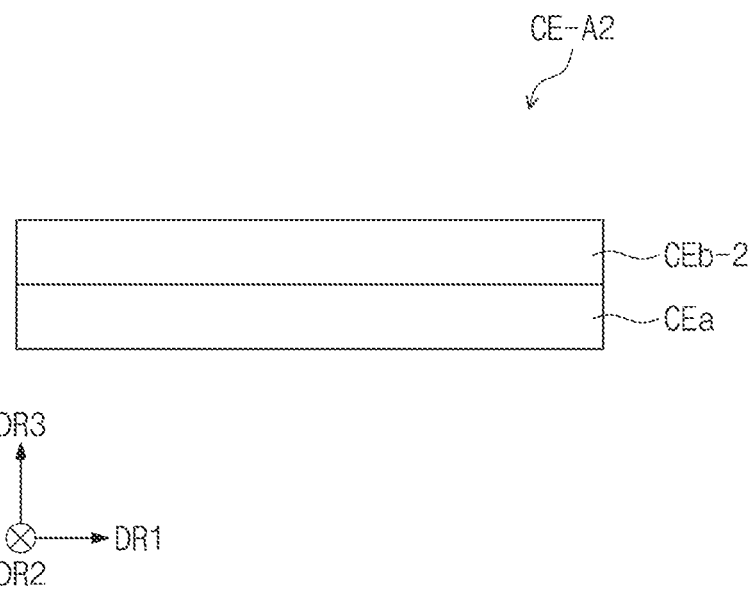
FIG. 4C is a cross-sectional view showing an embodiment of an auxiliary electrode.

FIG. 4C is a cross-sectional view showing an embodiment of an auxiliary electrode CE-A2.

Referring to FIGS. 3 and 4C, the auxiliary electrode CE-A2 may include an auxiliary inorganic layer CEa and an auxiliary conductive layer CEb-2. The auxiliary conductive layer CEb-2 may have a single-layer structure. That is, the auxiliary electrode CE-A2 may include only one conductive layer. As an example, the auxiliary conductive layer CEb-2 may include copper, silver, or gold.

Figure 5:
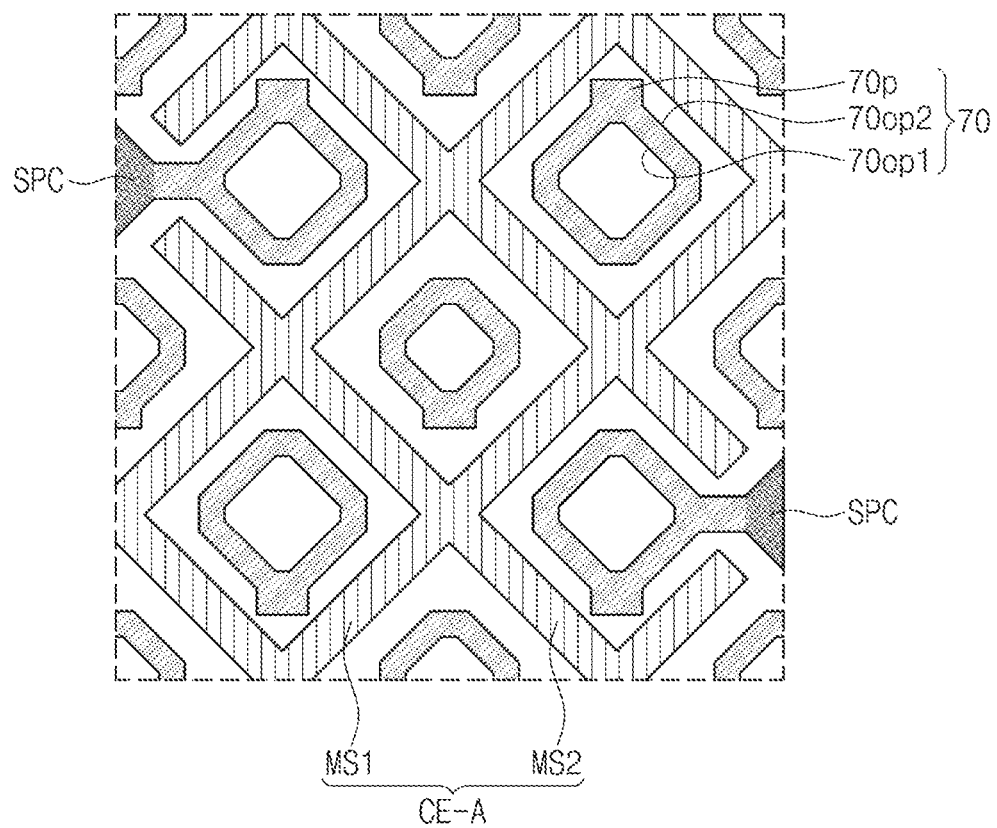
FIG. 5 is a plan view showing an embodiment of a portion of a display device.

FIG. 5 is a plan view showing an embodiment of a portion of the display device 1000.

FIGS. 3 and 5 show the pixel definition layer 70 and the auxiliary electrode CE-A arranged along the base layer 110. The pixel definition layer 70 may be divided into a plurality of pixel definition patterns 70p by the second opening 70op2. The pixel definition pattern 70p may have an enclosed shape in the plan view. When viewed in a plane, an inner surface of each of the pixel definition patterns 70p may define the first opening 70op1, and an outer surface of each of the pixel definition patterns 70p may define the second opening 70op2. The inner and outer surfaces may be referred to as an inner side surface and an outer side surface.

The auxiliary electrode CE-A may be disposed in the second opening 70op2. The auxiliary electrode CE-A may not be disposed in an area where a spacer SPC is disposed. The spacer SPC may include an organic material. The spacer SPC may have a single-layer or multi-layer structure. As an example, the spacer SPC may be additionally disposed on the pixel definition layer 70 or may be integrally formed of the same material as that of the pixel definition layer 70. The spacer SPC may have a thickness greater than a thickness of the pixel definition layer 70. Accordingly, the spacer SPC may have a height greater than a height of pixel definition layer 70 taken from a reference surface such as the base layer 110. That is, the spacer SPC may extend further from the circuit layer 120 than the pixel definition layer 70. As including or being formed of a same material, elements may be respective portions or patterns of a same material layer on the base layer 110, without being limited thereto.

The spacer SPC may include the same material as that of the pixel definition layer 70. A portion of the pixel definition layer 70 may define the spacer SPC. The pixel definition layer 70 may include a black material, and in this case, the spacer SPC may also include the black material, however, should not be limited thereto or thereby.

The auxiliary electrode CE-A may include or be defined by a first mesh line MS1 provided in plural including a plurality of first mesh lines MS1 and a second mesh line MS2 provided in plural including a plurality of second mesh lines MS2. The first mesh lines MS1 may extend in a first crossing direction DRC1 and may be arranged along a second crossing direction DRC2 intersecting each of the first crossing direction DRC1, the first direction DR1, the second direction DR2 and the third direction DR3. The second mesh lines MS2 may extend in the second crossing direction DRC2 and may be arranged along the first crossing direction DRC1. The first crossing direction DRC1 may be a direction between the first direction DR1 and the second direction DR2, and the second crossing direction DRC2 may be a direction crossing the first crossing direction DRC1, along a plane defined by the first direction DR1 and the second direction DR2 which intersect each other.

Figure 6A:
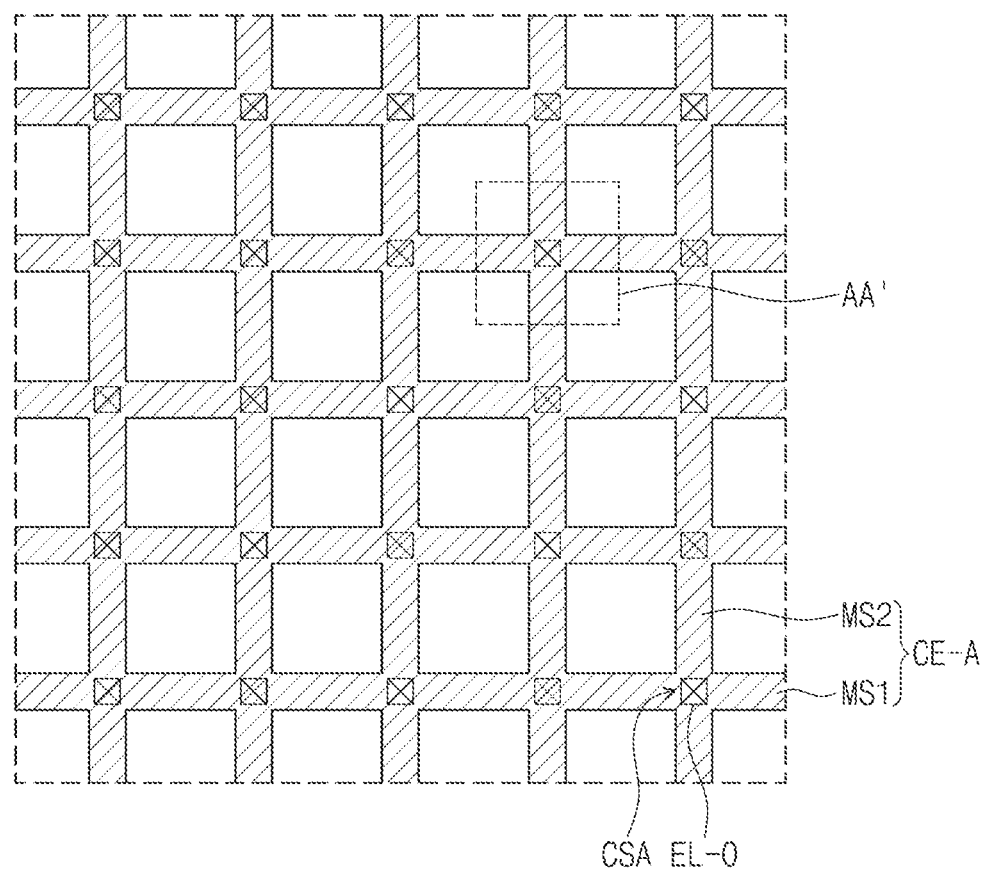
FIG. 6A is an enlarged plan view showing an embodiment of a portion of an auxiliary electrode.
Figure 6A:
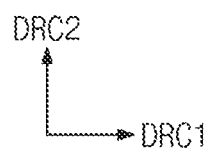

FIG. 6A is an enlarged plan view showing an embodiment of a portion of the auxiliary electrode CE-A.

Referring to FIGS. 3 and 6A, the through hole EL-O defined through the light emitting functional layer EL and in an area overlapping the auxiliary electrode CE-A is shown. The through hole EL-O may be defined through the light emitting functional layer EL overlapping a crossing area CSA where the first mesh line MS1 and the second mesh line MS2 of the auxiliary electrode CE-A intersect with each other. The crossing area CSA may be provided in plural including crossing areas CSA, and thus, the through hole EL-O may be provided in plural along the auxiliary electrode CE-A to include through holes EL-O.

According to an embodiment, the crossing areas CSA may overlap or correspond to the through holes EL-O, respectively. In this case, a laser drilling process may be applied to all areas overlapping the crossing areas CSA.

Figure 6B:
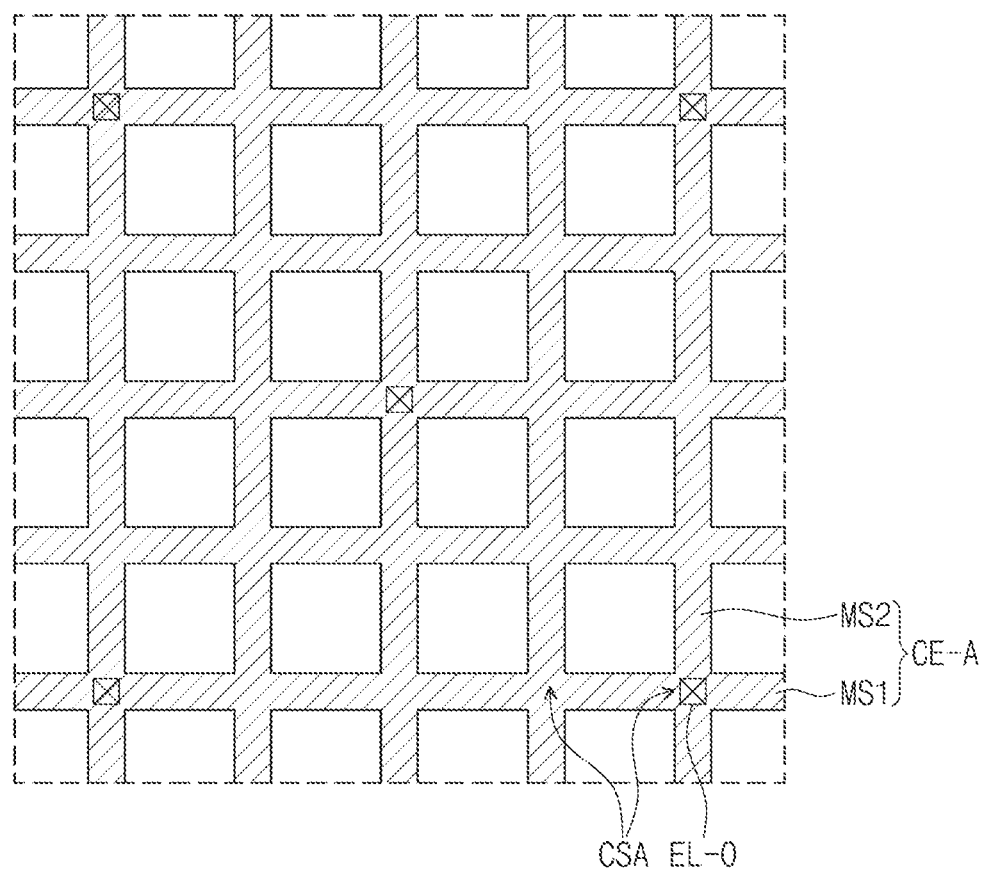
FIG. 6B is an enlarged plan view showing an embodiment of a portion of an auxiliary electrode.
Figure 6B:
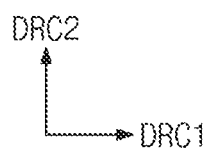

FIG. 6B is an enlarged plan view showing an embodiment of a portion of the auxiliary electrode CE-A.

Referring to FIGS. 3 and 6B, the through hole EL-O defined through the light emitting functional layer EL is shown. The through hole EL-O may be defined through the light emitting functional layer EL overlapping the crossing area CSA where the first mesh line MS1 and the second mesh line MS2 of the auxiliary electrode CE-A intersect with each other. The crossing area CSA may be provided in plural, and thus, the through hole EL-O may be provided in plural.

According to an embodiment, the through holes EL-O may overlap some of the crossing areas CSA. The number of the through holes EL-O may be smaller than the number of the crossing areas CSA. An arrangement density and a position of the through holes EL-O may be determined by taking into account a size of the display device 1000 (refer to FIG. 1) and a current imbalance phenomenon.

Figure 7A:
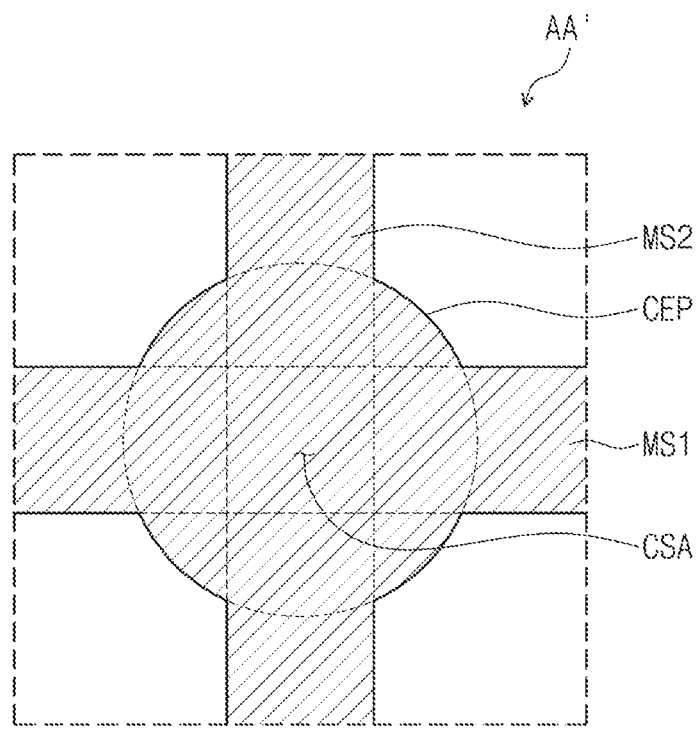
FIG. 7A is an enlarged plan view showing an embodiment of area AA' shown in FIG. 6A.

FIG. 7A is an enlarged plan view showing an embodiment of area AA' shown in FIG. 6A.

Referring to FIGS. 6A and 7A, the auxiliary electrode CE-A may further include an expansion portion CEP. The expansion portion CEP may be expanded in a direction away from the crossing area CSA where one of the first mesh lines MS1 and one of the second mesh lines MS2 intersect with each other. Along a same direction, a dimension of the auxiliary electrode CE-A at the expansion portion CEP may be larger than a dimension a respective mesh line extending to the crossing area CSA.

According to an embodiment, the expansion portion CEP may be defined in all the crossing areas CSA, however, should not be limited thereto or thereby. As an example, the expansion portion CEP may be defined only in some of the crossing areas CSA. As an example, when the through holes EL-O are defined only in some of the crossing areas CSA as shown in FIG. 6B, the expansion portion CEP may be provided only in the crossing areas CSA corresponding to positions in which the through holes EL-O are defined. That is, the number of the through holes EL-O in the light emitting functional layer EL is smaller than the number of the crossing areas CSA of the auxiliary electrode CE-A, and the number of the expansion portions CEP of the auxiliary electrode CE-A corresponds to the number of the through holes EL-O in the light emitting functional layer EL.

A size of the auxiliary electrode CE-A at the crossing area CSA may increase by the expansion portion CEP. Accordingly, damage applied to components disposed under the auxiliary electrode CE-A during the laser drilling process may be reduced or prevented by the expansion portion CEP.

The expansion portion CEP may be implemented in a variety of planar shapes as long as the planar size of the auxiliary electrode CE-A at the crossing area CSA may increase. FIG. 7A shows the expansion portion CEP with a circular shape, however, the planar shape of the expansion portion CEP should not be limited to the circular shape. As an example, the expansion portion CEP may have an oval shape or an atypical shape.

Figure 7B:
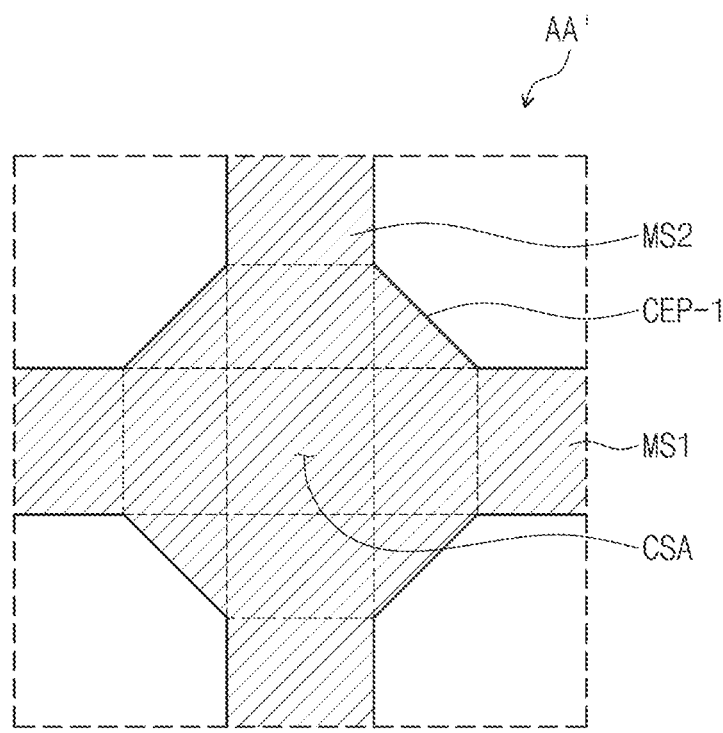
FIG. 7B is an enlarged plan view showing an embodiment of area AA' shown in FIG. 6A.

FIG. 7B is an enlarged plan view showing an embodiment of area AA' shown in FIG. 6A.

Referring to FIG. 7B, an expansion portion CEP-1 may have a planar shape different from that of the expansion portion CEP shown in FIG. 7A. The expansion portion CEP-1 may have an octagonal shape, however, the planar shape of the expansion portion CEP-1 should not be limited to the octagonal shape. According to an embodiment, the expansion portion CEP-1 may have a polygonal shape such as a quadrangular shape or a pentagonal shape.

Figure 8:
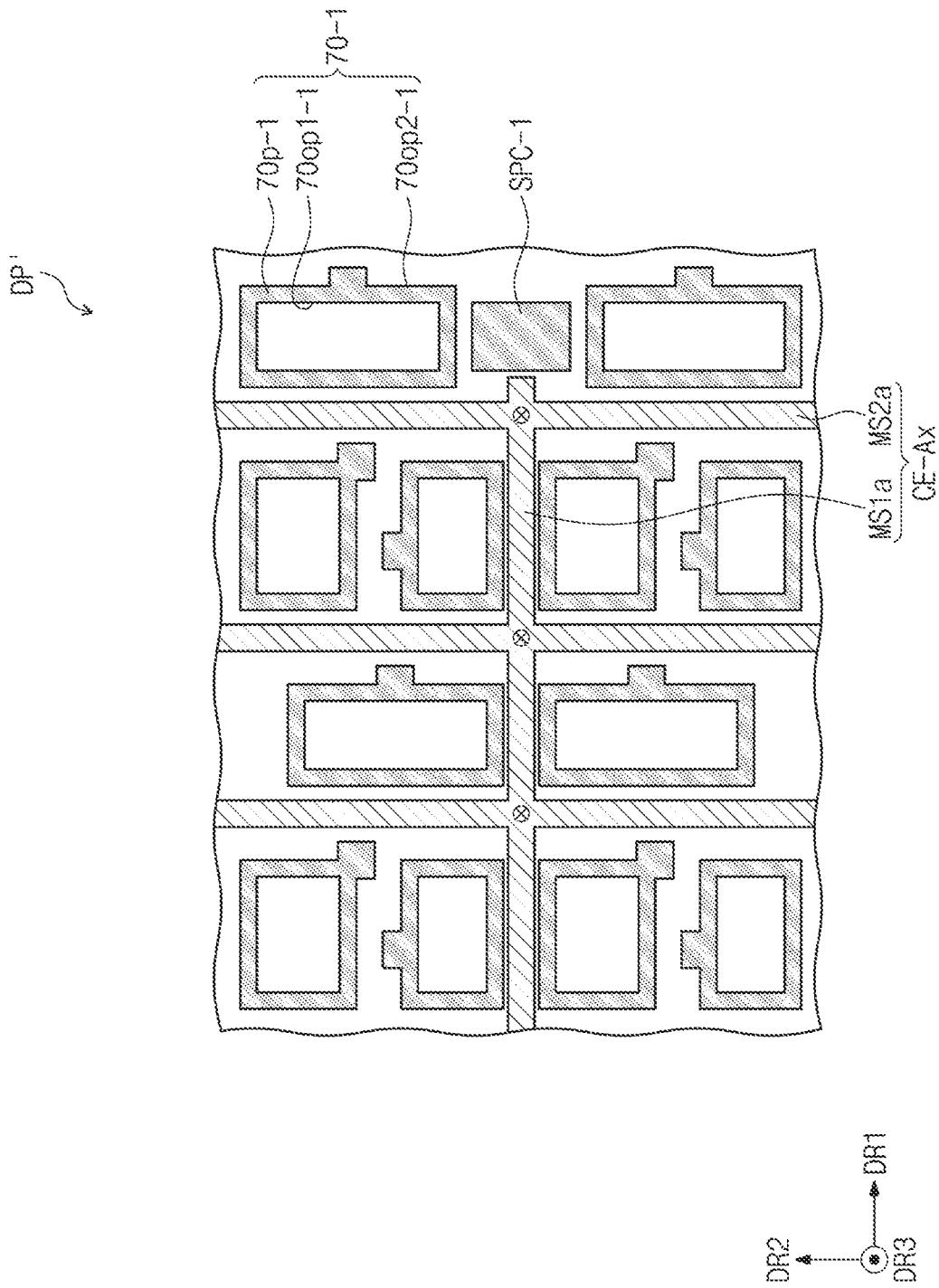
FIG. 8 is a plan view showing an embodiment of a portion of a display device.

FIG. 8 is a plan view showing an embodiment of a portion of a display device DP'.

Referring to FIGS. 3 and 8, a pixel definition layer 70-1 and an auxiliary electrode CE-Ax are shown. The pixel definition layer 70-1 may be divided into a plurality of pixel definition patterns 70p-1 by a second opening 70op2-1. When viewed in a plane, an inner surface of each of the pixel definition patterns 70p-1 may define a first opening 70op1-1, and an outer surface of each of the pixel definition patterns 70p-1 may define a second opening 70op2-1.

The auxiliary electrode CE-Ax may be disposed in the second opening 70op2-1. The auxiliary electrode CE-Ax may not be disposed in an area where a spacer SPC-1 is disposed. That is, the auxiliary electrode CE-Ax may be spaced apart from the spacer SPC-1 in a direction along the base layer 110. The spacer SPC-1 may include an organic material. The spacer SPC-1 may have a single-layer or multi-layer structure. As an example, the spacer SPC-1 may be additionally disposed on the pixel definition layer 70-1 or may include the same material as that of the pixel definition layer 70-1 to be formed integrally with the pixel definition layer 70-1. The spacer SPC-1 may have a thickness greater than a thickness of the pixel definition layer 70-1.

The spacer SPC-1 may include the same material as that of the pixel definition layer 70-1. The pixel definition layer 70-1 may include a black material, and in this case, the spacer SPC-1 may also include the black material, however, should not be limited thereto or thereby.

The auxiliary electrode CE-Ax may include first mesh lines MS1a and second mesh lines MS2a. The first mesh lines MS1a may extend along the first direction DR1. FIG. 8 shows one of the first mesh line MS1a, however, the first mesh lines MS1a may be arranged along the second direction DR2. The second mesh lines MS2a may extend along the second direction DR2 and may be arranged along the first direction DR1.

Figure 9:
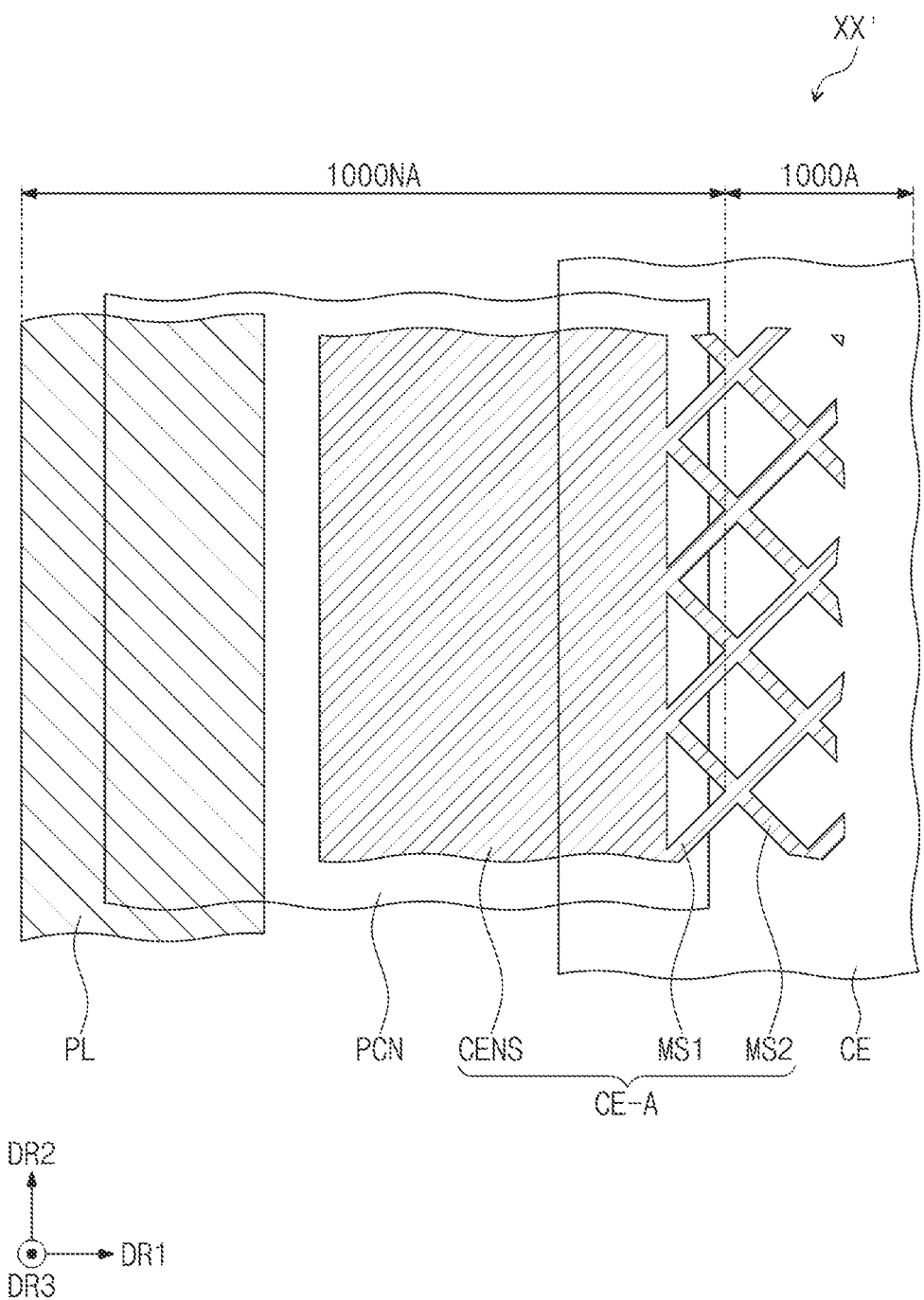
FIG. 9 is an enlarged plan view showing an embodiment of area XX' shown in FIG. 1.
Figure 10:
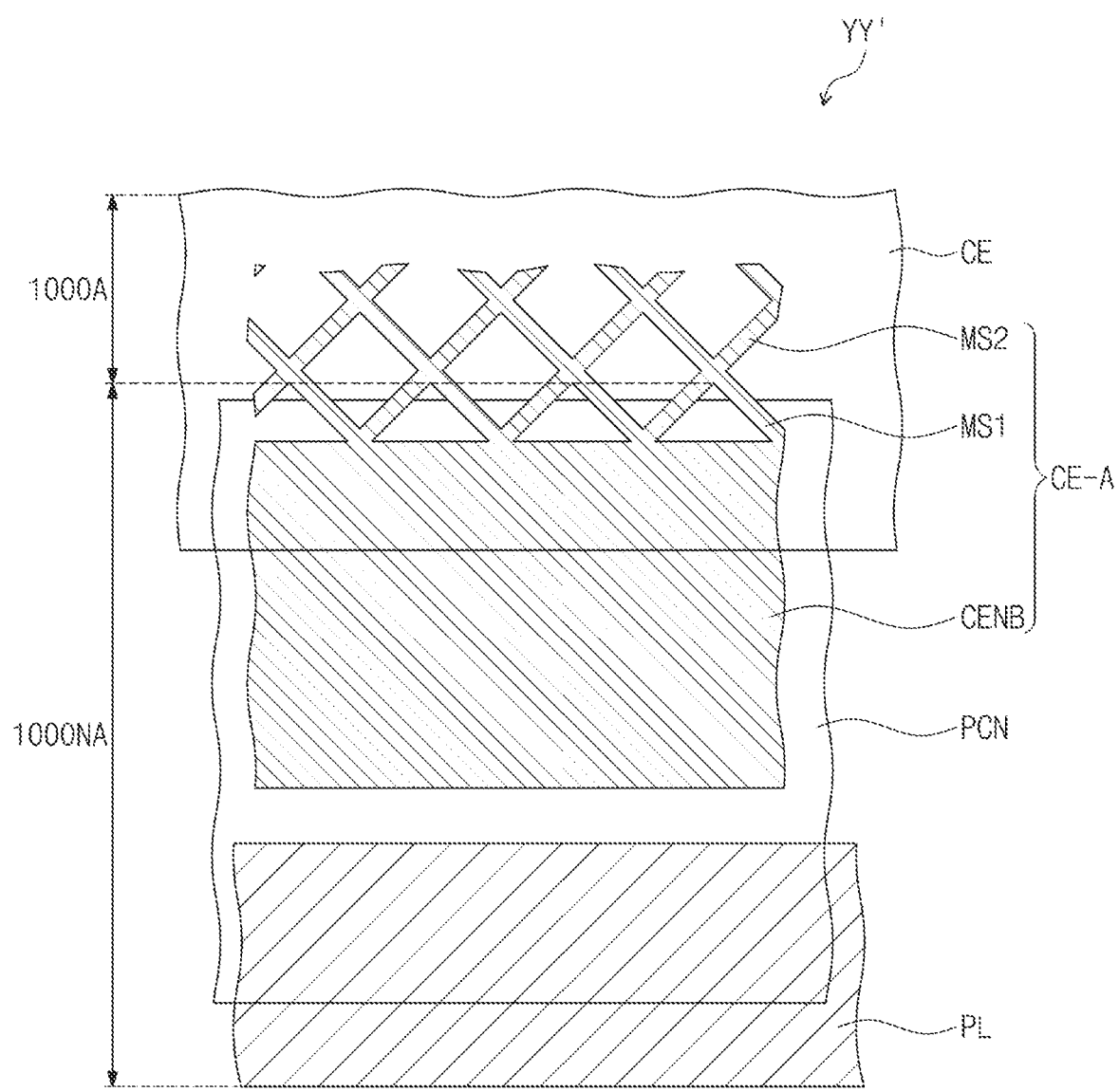
FIG. 10 is an enlarged plan view showing an embodiment of area YY' shown in FIG. 1.

FIG. 9 is an enlarged plan view showing an embodiment of area XX' shown in FIG. 1, and FIG. 10 is an enlarged plan view showing an embodiment of area YY' shown in FIG. 1.

Referring to FIGS. 9 and 10, the common electrode CE, the auxiliary electrode CE-A, a connection electrode PCN, and a power line PL are shown.

Referring to FIGS. 3, 9, and 10, the common electrode CE may overlap an entirety of the active area 1000A. The common electrode CE may be further expanded from the active area 1000A to the peripheral area 1000NA.

The auxiliary electrode CE-A may include the first and second mesh lines MS1 and MS2 disposed in the active area 1000A and first and second auxiliary connection portions CENS and CENB disposed in the peripheral area 1000NA. Since each of the first and second auxiliary connection portions CENS and CENB overlaps only the peripheral area 1000NA, openings may not be defined through the first and second auxiliary connection portions CENS and CENB, however, should not be particularly limited. That is, the first and second auxiliary connection portions CENS and CENB may be solid portions of the auxiliary electrode CE-A and omit openings thereof. According to an embodiment, openings may be defined through the first and second auxiliary connection portions CENS and CENB to discharge gases generated from layers disposed under the first and second auxiliary connection portions CENS and CENB.

The power line PL may be a line receiving a power source, e.g., ground voltage. The power line PL may include a plurality of conductive layers. As an example, the power line PL may include a first power line layer including the same material as that of the first connection electrode CNE1 and a second power line layer including the same material as that of the second connection electrode CNE2. As an example, the first power line layer may be formed through the same process as the first connection electrode CNE1, and the second power line layer may be formed through the same process as the second connection electrode CNE2, however, should not be limited thereto or thereby. According to an embodiment, the power line PL may include one conductive layer. As an example, the power line PL may include only one power line layer that includes the same material as the first connection electrode CNE1 or is a portion of same material layer as the first connection electrode CNE1.

The display device 1000 may further include the connection electrode PCN connecting the power line PL and the auxiliary electrode CE-A to each other. A portion of the connection electrode PCN may be in contact with the power line PL, and another portion of the connection electrode PCN may be in contact with the auxiliary electrode CE-A. The connection electrode PCN may be electrically insulated from the pixel electrode AE shown in FIG. 3, however, the connection electrode PCN may include the same material as the pixel electrode AE and may be substantially simultaneously formed with the pixel electrode AE. The connection electrode PCN may be provided with an opening defined therethrough to discharge gases generated from layers disposed under the connection electrode PCN. However, according to an embodiment, the opening may not be defined through the connection electrode PCN.

The common electrode CE may be in contact with the auxiliary electrode CE-A not only in the active area 1000A but also in the peripheral area 1000NA. As an example, the common electrode CE may be in contact with the auxiliary electrode CE-A via the through hole EL-O defined through the light emitting functional layer EL in the active area 1000A. In addition, the common electrode CE may be in contact with each of the first and second auxiliary connection portions CENS and CENB in the peripheral area 1000NA.

The power supplied via the power line PL may be applied to the common electrode CE via the connection electrode PCN and the auxiliary electrode CE-A. According to an embodiment, the auxiliary electrode CE-A may receive a voltage from the power line PL (e.g., a power) via the connection electrode PCN in a first portion spaced apart from the active area 1000A along the first direction DR1 and a second portion spaced apart from the active area 1000A along the second direction DR2. The first portion spaced apart from the active area 1000A along the first direction DR1 and the second portion spaced apart from the active area 1000A along the second direction DR2 may be a point at which the power is received by the auxiliary electrode CE-A via the connection electrode PCN. The common electrode CE may be in contact with each of the first and second auxiliary connection portions CENS and CENB in portions spaced apart from the active area 1000A. The common electrode CE may be in contact with each of the first and second auxiliary connection portions CENS and CENB in the peripheral area 1000NA defined on left and right of the active area 1000A and in the peripheral area 1000NA defined below the active area 1000A. In this case, the common electrode CE may receive the power through multiple points rather than receiving the power through an area at which the power is concentrated. Accordingly, the temperature uneven phenomenon in which the temperature in the area increases may be reduced or prevented. In addition, as the electrical resistance of the common electrode CE is reduced, the optical uniformity, e.g., the luminance uniformity, the color uniformity, or the like, may be improved in the active area 1000A (refer to FIG. 1).

Figure 11:
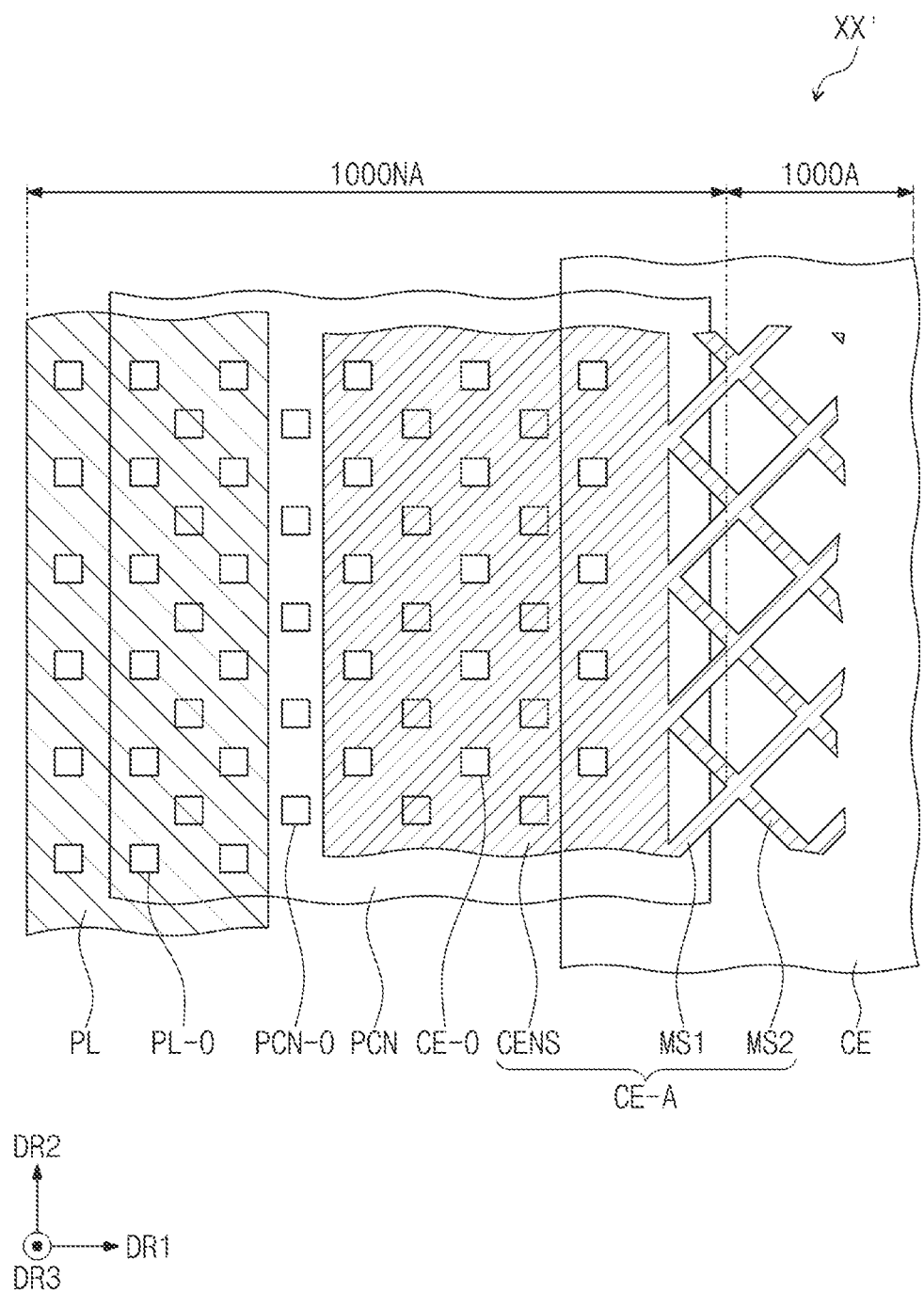
FIG. 11 is an enlarged plan view showing an embodiment of area XX' shown in FIG. 1.

FIG. 11 is an enlarged plan view showing an embodiment of area XX' shown in FIG. 1.

Referring to FIG. 11, a common electrode CE, an auxiliary electrode CE-A, a connection electrode PCN, and a power line PL are shown. When compared with FIG. 9, the power line PL, the connection electrode PCN, and a first auxiliary connection portion CENS may be provided with first, second, and third openings PL-O, PCN-O, and CE-O, respectively.

The first, second, and third openings PL-O, PCN-O, and CE-O may be defined through the power line PL, the connection electrode PCN, and the first auxiliary connection portion CENS, respectively, to discharge gases.

As an example, the first opening PL-O defined through the power line PL may be provided in plural including first openings PL-O. The second opening PCN-O defined through the connection electrode PCN may be provided in plural including second openings PCN-O. The third opening CE-O defined through the first auxiliary connection portion CENS may be provided in plural including third openings CE-O.

Each of the first openings PL-O, the second openings PCN-O, and the third openings CE-O may be arranged along the first direction DR1 and along the second direction DR2 in a matrix form, however, should not be limited thereto or thereby. The arrangement of each of the first openings PL-O, the second openings PCN-O, and the third openings CE-O may be changed in various ways.

In addition, each of the first openings PL-O, each of the second openings PCN-O, and each of the third openings CE-O shown in FIG. 11 may have a quadrangular shape as a representative example, however, the planar shape should not be particularly limited. As an example, the first openings PL-O, the second openings PCN-O, and the third openings CE-O may have a variety of planar shapes, such as a circular shape, a triangular shape, an oval shape, a rectangular shape, a hexagonal shape, an atypical shape, a slit shape extending in a direction, etc.

In addition, the first openings PL-O, the second openings PCN-O, and the third openings CE-O may not overlap each other, however, should not be particularly limited. Referring to FIG. 11, for example, second openings PCN-O overlap a solid portion of the power line PL and a solid portion of the first auxiliary connection portion CENS. The second openings PCN-O are spaced apart from each of the first openings PL-O and the third openings CE-O in a direction along the base layer 110.

In an embodiment, some of the first openings PL-O may overlap or correspond to some of the second openings PCN-O, and some of the second openings PCN-O may overlap or correspond to some of the third openings CE-O.

Although embodiments have been described, it is understood that the invention should not be limited to these embodiments but various changes and modifications can be made by one ordinary skilled in the art within the spirit and scope of the disclosure as hereinafter claimed. Therefore, the disclosed subject matter should not be limited to any single embodiment described herein, and the scope of the invention shall be determined according to the attached claims.

What is claimed is:

1. A display device comprising:
    a display area including a light emitting element,
    a circuit layer;
    a pixel electrode of the light emitting element which is on the circuit layer and electrically connected to the circuit layer;
    a pixel definition layer on the circuit layer and defining each of:
        a first opening which exposes the pixel electrode of the light emitting element to outside the pixel definition layer, and
        a second opening spaced apart from the pixel electrode;
    an auxiliary electrode through which power is provided to the light emitting element, the auxiliary electrode in the second opening of the pixel definition layer and comprising a mesh shape including a plurality of mesh lines in the display area;
    a light emitting functional layer of the light emitting element which is on each of the pixel electrode, the pixel definition layer and the auxiliary electrode and defines a through hole corresponding to the auxiliary electrode which is in the second opening of the pixel definition layer; and
    a common electrode of the light emitting element on the light emitting functional layer and electrically connected to the auxiliary electrode at the through hole in the light emitting functional layer.

2. The display device of claim 1, wherein the auxiliary electrode further comprises:
    an inorganic layer on the circuit layer; and
    a conductive layer on the inorganic layer.

3. The display device of claim 2, wherein the inorganic layer of the auxiliary electrode comprises indium zinc oxide, indium tin oxide, silicon oxide, silicon oxynitride, or silicon nitride.

4. The display device of claim 1, wherein
    the auxiliary electrode further comprises:
        a plurality of first mesh lines each extending along a first direction and arranged along a second direction crossing the first direction;
        a plurality of second mesh lines each extending along the second direction and arranged along the first direction; and
        a crossing area at which a first mesh line among the plurality of first mesh lines and a second mesh line among the plurality of second mesh lines intersect with each other, and
    the through hole which is defined by the light emitting functional layer corresponds to the crossing area of the auxiliary electrode.

5. The display device of claim 4, wherein the plurality of first mesh lines and the plurality of second mesh lines are connected to each other to have an integral shape.

6. The display device of claim 4, wherein the auxiliary electrode further comprises at the crossing area, an expansion portion which is extended from the first mesh line and the second mesh line in a direction away from the crossing area.

7. The display device of claim 6, wherein the expansion portion has a circular shape or a polygonal shape.

8. The display device of claim 6, wherein the auxiliary electrode further comprises:
    the crossing area provided in plural including a plurality of crossing areas, and each of the plurality of crossing areas including the expansion portion to define a plurality of expansion portions.

9. The display device of claim 8, wherein
the light emitting functional layer includes the through hole provided in plural including a plurality of through holes, and
the plurality of through holes of the light emitting functional layer respectively correspond to the plurality of crossing areas of the auxiliary electrode.

10. The display device of claim 8, wherein
the light emitting functional layer includes the through hole provided in plural including a number of the through holes,
the auxiliary electrode further comprises a number of the crossing areas, and
the number of the through holes in the light emitting functional layer is smaller than the number of the crossing areas of the auxiliary electrode.

11. The display device of claim 6, wherein
the auxiliary electrode further comprises:
the crossing area provided in plural including a number of the crossing areas,
the expansion portion provided in plural including a number of the expansion portions, and
the number of the expansion portions smaller than the number of the crossing areas, and
the light emitting functional layer includes the through hole provided in plural including a number of the through holes,
wherein
the number of the through holes in the light emitting functional layer is smaller than the number of the crossing areas of the auxiliary electrode, and
the number of the expansion portions of the auxiliary electrode corresponds to the number of the through holes in the light emitting functional layer.

12. The display device of claim 1, further comprising a spacer which is spaced apart from the through hole in the light emitting functional layer and extends further from the circuit layer than the pixel definition layer.

13. The display device of claim 12, wherein the auxiliary electrode is spaced apart from the spacer.

14. The display device of claim 1, further comprising:
a peripheral area which is adjacent to the display area along both a first direction and a second direction which crosses the first direction,
the auxiliary electrode in the display area and in the peripheral area, and
within the peripheral area:
a power line which is electrically connected to the auxiliary electrode and from which the power is provided,
a connection electrode which electrical connects the power line and the auxiliary electrode to each other, and
the auxiliary electrode receives the power via the connection electrode at a first portion of the auxiliary electrode which is spaced apart from the display area along the first direction and a second portion of the auxiliary electrode which is spaced apart from the display area along the second direction.

15. A display device comprising:
a circuit layer;
a pixel electrode of a light emitting element which is on the circuit layer and electrically connected to the circuit layer;
a pixel definition layer on the circuit layer and including a plurality of pixel definition patterns overlapping an edge of the pixel electrode;
an auxiliary electrode on the circuit layer and comprising a mesh shape including a plurality of mesh lines disposed between the plurality of pixel definition patterns;
a light emitting functional layer of the light emitting element which is on each of the pixel electrode, the plurality of pixel definition patterns and the auxiliary electrode, the light emitting functional layer defining a through hole corresponding to the auxiliary electrode; and
a common electrode of the light emitting element which is on the light emitting functional layer and electrically connected to the auxiliary electrode at the through hole defined in the light emitting functional layer.

16. The display device of claim 15, wherein
the plurality of pixel definition patterns are spaced apart from each other, and
the auxiliary electrode defines a plurality of openings in which the plurality of pixel definition patterns are provided.

17. The display device of claim 15, wherein the auxiliary electrode further comprises:
an inorganic layer on the circuit layer; and
a conductive layer on the inorganic layer.

18. The display device of claim 17, wherein the inorganic layer comprises indium zinc oxide, indium tin oxide, silicon oxide, silicon oxynitride, or silicon nitride.

19. The display device of claim 15, wherein
the auxiliary electrode further comprises:
a plurality of first mesh lines extending along a first direction and arranged along a second direction which crosses the first direction;
a plurality second mesh lines extending along the second direction and arranged along the first direction; and
a crossing area at which a first mesh line among the plurality of first mesh lines and a second mesh line among the plurality of second mesh lines intersect with each other, and
the through hole which is defined by the light emitting functional layer of the light emitting element corresponds to the crossing area of the auxiliary electrode.

20. The display device of claim 19, wherein the auxiliary electrode further comprises at the crossing area, an expansion portion which is extended from the first mesh line and the second mesh line in a direction away from the crossing area.

* * * * *